(12) United States Patent
Drinovsky et al.

(10) Patent No.: US 10,985,720 B2
(45) Date of Patent: Apr. 20, 2021

(54) CAPACITIVE AMPLIFIER CIRCUIT WITH HIGH INPUT COMMON MODE VOLTAGE AND METHOD FOR USING THE SAME

(71) Applicant: Allegro MicroSystems, LLC, Manchester, NH (US)

(72) Inventors: Martin Drinovsky, Horomerice (CZ); Karel Znojemsky, Ricany (CZ)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/435,884

(22) Filed: Jun. 10, 2019

(65) Prior Publication Data
US 2020/0389139 A1 Dec. 10, 2020

(51) Int. Cl.
*H03F 1/02* (2006.01)
*H03F 3/45* (2006.01)

(52) U.S. Cl.
CPC ..... *H03F 3/45672* (2013.01); *H03F 3/45681* (2013.01)

(58) Field of Classification Search
CPC ............... H03F 1/02; H03F 3/005; H03F 3/45
USPC ............................... 330/9, 258; 327/124, 307
See application file for complete search history.

(56) References Cited

U.S. PATENT DOCUMENTS

| | | |
|---|---|---|
| 7,990,209 B2 | 8/2011 | Romero |
| 8,416,014 B2 | 4/2013 | Romero |
| 2004/0032294 A1* | 2/2004 | Rossi ................. H03F 3/45475 330/9 |

* cited by examiner

*Primary Examiner* — Steven J Mottola
(74) *Attorney, Agent, or Firm* — Daly, Crowley, Mofford & Durkee, LLP

(57) ABSTRACT

A circuit includes a first amplifier having first and second inputs and first and second output, first and second input capacitors, a first feedback capacitor selectively coupled between the first input and the first output, and a second feedback capacitor selectively coupled between the second input and the second output. During a second phase of operation, the first and second feedback capacitors are decoupled from the output and the first amplifier is configured to sample an input common mode voltage, an output common mode voltage, and an input offset voltage of the first amplifier on the first and second input capacitors. During a first phase of operation, the first feedback capacitor is coupled between the input and the output, the second feedback capacitor is coupled between the input and the output, and the first amplifier is configured to amplify a differential input signal provided across the first and second inputs.

16 Claims, 7 Drawing Sheets

CAPACITIVE AMPLIFIER CIRCUIT WITH HIGH INPUT COMMON MODE VOLTAGE AND METHOD FOR USING THE SAME

CROSS REFERENCE TO RELATED APPLICATIONS

Not Applicable.

STATEMENT REGARDING FEDERALLY SPONSORED RESEARCH

Not Applicable.

FIELD

This disclosure relates generally to circuits and, more particularly, to circuits used to sense small differential voltages superimposed on large common mode voltages.

BACKGROUND

A variety of circuits to control and drive electric motors are known. In some cases, small differential voltages may need to be sensed on high common mode voltages, for example in sensing motor winding current. The input common mode voltage can have large swings between a high input voltage and ground, and small differential voltages may need to be sensed.

SUMMARY

The present disclosure can provide a capacitive amplifier with high input common mode voltage that senses small differential voltages superposed on the high input common mode voltage which has large swing.

In accordance with an embodiment, a circuit for sensing a differential voltage includes a first amplifier having first and second inputs and first and second outputs, a first input capacitor coupled to the first input, a second input capacitor coupled to the second input, a first feedback capacitor selectively coupled between the first input and the first output, and a second feedback capacitor selectively coupled between the second input and the second output. During a first phase of operation, the first and second feedback capacitors are decoupled from the first and second outputs and the first amplifier is configured to sample an input common mode voltage, an output common mode voltage, and an input offset voltage of the first amplifier on the first input capacitor and the second input capacitor and wherein the input offset voltage of the first amplifier is sampled on the first and second feedback capacitors. During a second phase of operation, the first feedback capacitor is coupled between the first input and the first output, the second feedback capacitor is coupled between the second input and the output, and the first amplifier is configured to amplify a differential input signal provided across the first and second inputs, and wherein the input common mode voltage stored on the first and second input capacitors is rejected.

The amplifier circuit can include one or more of the following features alone or in combination. The amplifier circuit can include a second amplifier having third and fourth inputs and third and fourth outputs, a third input capacitor coupled to the third input, a fourth input capacitor coupled to the fourth input, a third feedback capacitor selectively coupled between the third input and the third output, and a fourth feedback capacitor selectively coupled between the fourth input and the fourth output. During the second phase of operation, the second amplifier can be configured to sample an input common mode voltage, an output common mode voltage, and an input offset voltage of the second amplifier on the third input capacitor and the fourth input capacitor, and wherein the input offset voltage of the second amplifier is sampled on the third and fourth feedback capacitors. During the first phase of operation, the second amplifier can be configured to amplify an input differential signal at the input of the second amplifier, and wherein the input common mode voltage stored on the third and fourth input capacitors is rejected. Amplifying by the second amplifier can overlap with sampling by the first amplifier and amplifying by the first amplifier can overlap with sampling by the second amplifier. Amplifying by the first amplifier can overlap for a predetermined period of time with amplifying by the second amplifier. The circuit can further include an input switch coupled between first and second inputs of the circuit and the first, the second, the third and the fourth input capacitors of the first and second amplifiers. The input switch can include a plurality of switches for switching between the first phase and the second phase. The input switch can be configured to couple the input common mode signal to the respective input capacitors during the first phase and couple the input differential signal to the respective input capacitors during the second phase. The circuit can further include an output switch coupled to the outputs of the first amplifier and the first and second outputs of the second amplifier and outputs of the circuit. The output switch can be configured to couples the output of the first amplifier to the circuit output during the second phase and the output of the second amplifier to the circuit output during the first phase. The circuit can further include sampling phase switches and amplification phase switches coupled between the respective inputs and outputs of each amplifier.

In accordance with another embodiment, a method includes sampling, by a first amplifier, an input common mode voltage, an output common mode voltage, and an input offset voltage of the first amplifier at first and second input capacitors coupled, respectively, to first and second inputs of the first amplifier, wherein the input offset voltage of the first amplifier is sampled on the first and second feedback capacitors during a first phase, and amplifying, by the first amplifier, an input differential signal provided across the first and second inputs of the first amplifier and rejecting an input common mode signal which is stored on the first and second input capacitors during a second phase of operation.

The method can include one or more of the following features alone or in combination. The method can include during the second phase of operation, a first feedback capacitor is coupled between the first input and the first output, and a second feedback capacitor is coupled between the second input and the second output. The method can include, during the first phase of operation, the first and second feedback capacitors are decoupled from the output. The method can include sampling, by a second amplifier, an input common mode voltage, an output common mode voltage, and an input offset voltage of the second amplifier on third and fourth input capacitors coupled, respectively, to third and fourth inputs of the second amplifier and wherein the input offset voltage of the second amplifier is sampled on third and fourth feedback capacitors during the second phase, and amplifying, by the second amplifier, an input signal provided across the third and fourth inputs of the second amplifier and rejecting an input common mode signal stored on the third and fourth input capacitors during the first phase.

In accordance with another embodiment, an apparatus for sensing a small differential voltage superposed on a high voltage (HV) common mode voltage, includes means for amplifying an input differential signal provided across first and second inputs and rejecting an input common mode signal stored on first and second input capacitors during a first phase, and means for sampling an input common mode voltage, an output common mode voltage, and an input offset voltage on the first and second input capacitors coupled, respectively, to the first and second inputs and wherein the input offset voltage is sampled on the first and second feedback capacitors during a second phase.

The apparatus can include one or more of the following features alone or in combination. The apparatus can include means for sampling an input common mode voltage, an output common mode voltage, and an input offset voltage on third and fourth input capacitors coupled, respectively, to third and fourth inputs and wherein the input offset voltage is sampled on the third and fourth feedback capacitors during the first phase, and means for amplifying an input differential signal provided across the third and fourth inputs and rejecting an input common mode signal stored on the third and fourth input capacitors during the second phase.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
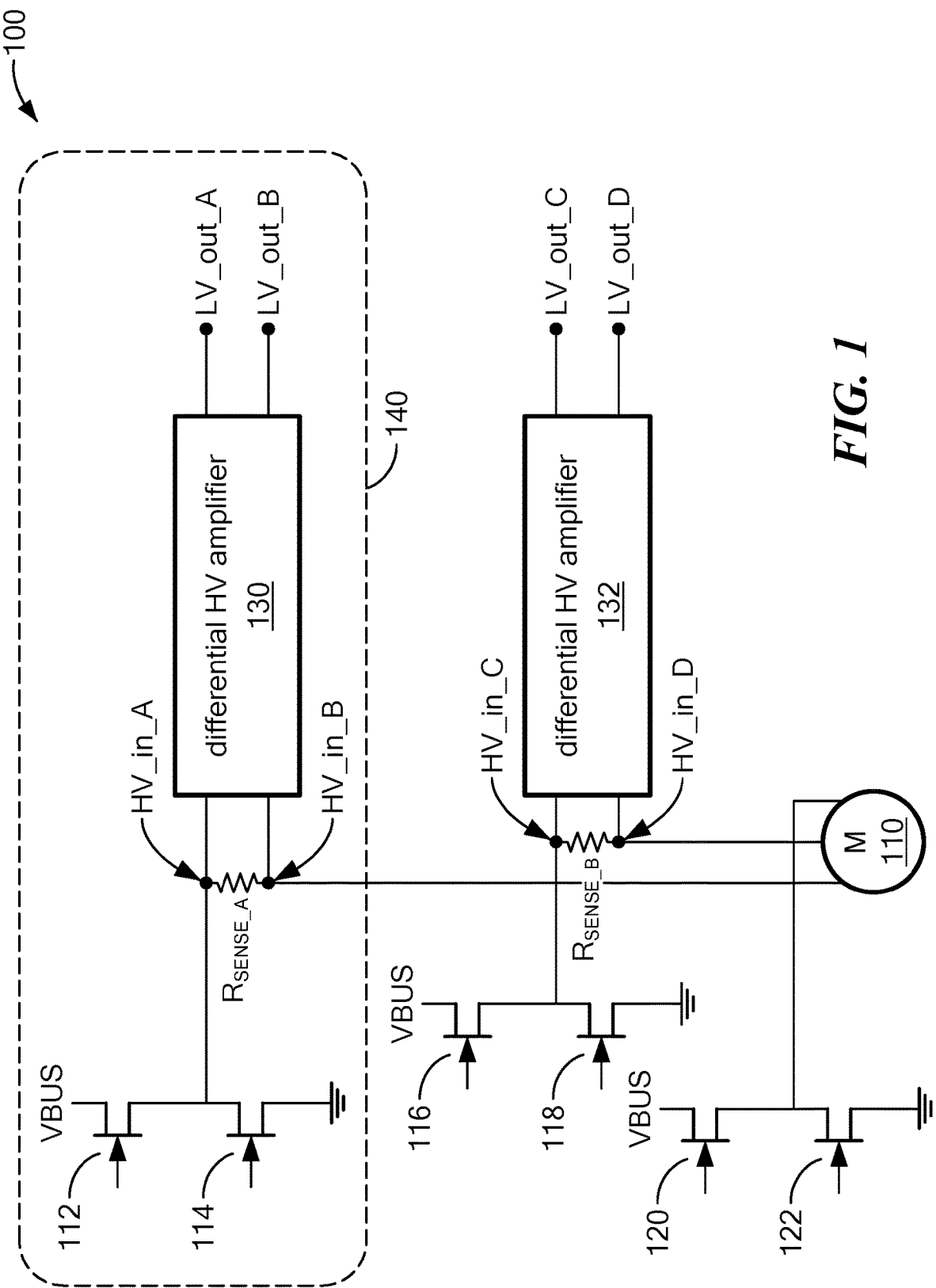
FIG. 1 is a block diagram of an example circuit configured to sense a small differential voltage using differential amplifiers.

Referring to FIG. 1, a block diagram of an example motor control system 100 including differential amplifiers 130, 132 to sense motor winding current is shown. The system 100 includes a plurality of switches 112, 114, 116, 118, 120, and 122 configured to control the current supplied to the windings of the motor 110. The differential amplifiers 130, 132 are coupled to sense a small differential voltage HV_in_A-HV_in_B across $R_{SENSE\_A}$ and HV_in_C-HV_in_D across $R_{SENSE\_B}$, respectively. The small differential voltage is superposed on a large common mode voltage and the common mode can swing above VBUS, the supply voltage, and below GND, the ground reference. The outputs LV_out A, LV_out_B and LV_out_C, LV_out_D of the differential amplifiers 130, 132 provide the amplified differential voltage.

The winding currents of the motor 110 are sensed by the differential amplifiers 130, 132. However, as the speed of the motor increases, the differential amplifiers may not be able to accurately detect the differential voltage at the resistors $R_{SENSE\_A}$ and $R_{SENSE\_B}$. For example, the input common mode voltage can swing from −10V to +50V, whereas the differential voltage across the resistors $R_{SENSE\_A}$ and $R_{SENSE\_B}$ can be significantly smaller, such as 100 millivolts (mV), which may become very difficult to detect as the input common mode voltage bounces between its large voltage swings.

Accordingly, in accordance with the present disclosure, a circuit including at least two capacitively coupled amplifiers with high input common mode voltages are configured to sense small differential voltages superposed on the high common mode voltage. The circuit is configured to operate in two alternating phases to accomplish the signal amplification on a high input common mode without aliasing. According to the present disclosure, in a first phase, the first amplifier is amplifying the input signal and the second amplifier is sampling, and in a second phase the first amplifier is sampling and the second amplifier is amplifying. There may be a predetermined period of time when both the first and second amplifiers are amplifying at the same time, which can further reduce or eliminate any aliasing problems.

Although FIG. 1 illustrates a motor control system 100 including differential amplifiers 130, 132 for sensing motor winding current, it will be appreciated that the circuitry and techniques herein are applicable to any circuit or system having a need to sense a small differential voltage superimposed on a high common mode voltage.

Figure 2:
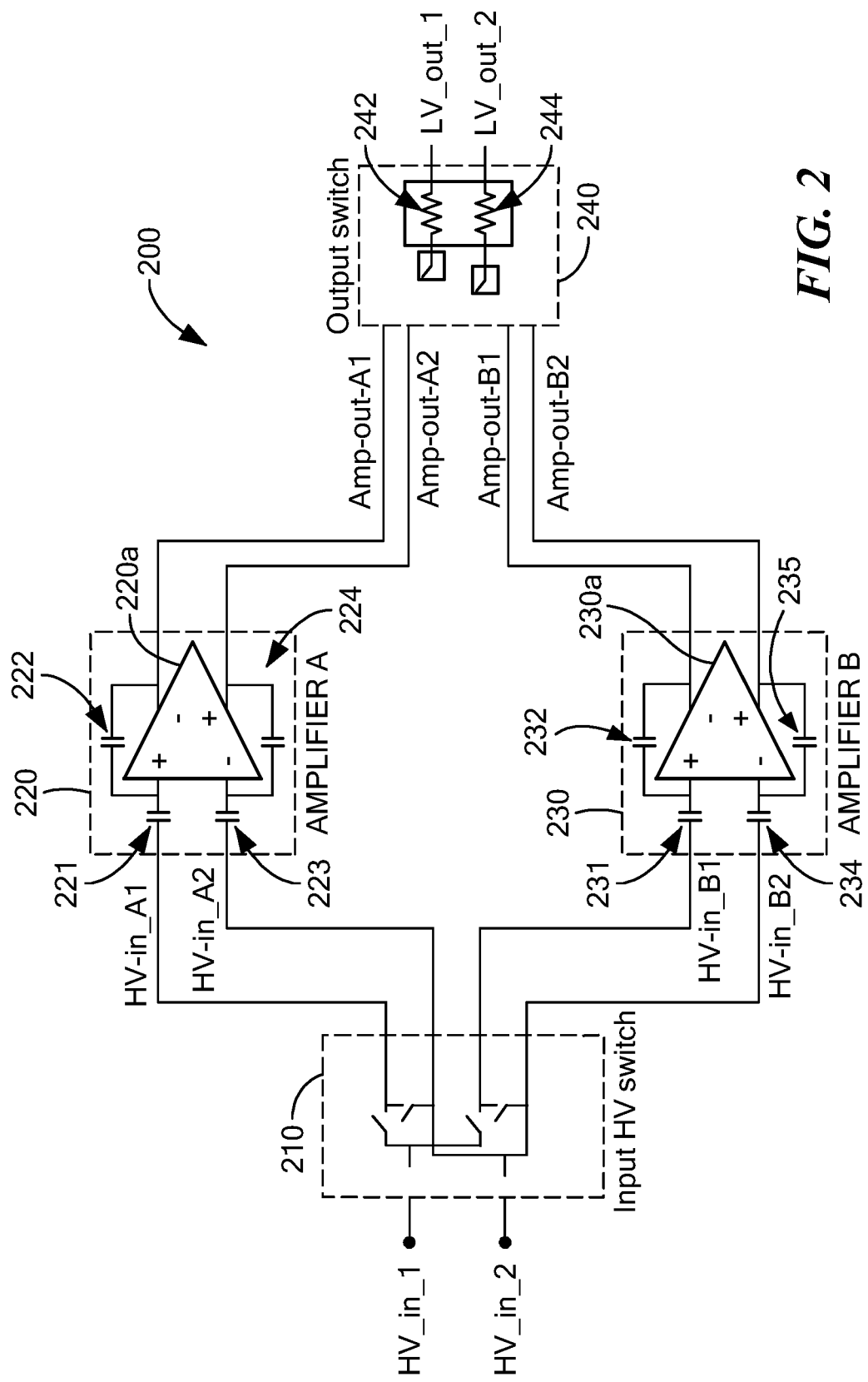
FIG. 2 is a schematic block diagram of a circuit including capacitively coupled amplifiers that each alternate between two phases of operation, according to the present disclosure.

FIG. 2 is a schematic block diagram of a circuit 200 including capacitively coupled amplifiers that each alternate between two phases of operation, according to the present disclosure. It will be appreciated that the circuit 200 is suitable to provide a differential high voltage amplifier such as amplifier 130 and/or amplifier 132 of FIG. 1. Note that the input to the amplifier 130 is shown as HV_in_A and HV_in_B, which may be the same as or substantially similar to inputs HV_in_1 and HV_in_2 of FIG. 2.

The circuit 200 includes an input high voltage (HV) switch 210, a first amplifier circuit 220, a second amplifier circuit 230, and an output switch 240. The first amplifier circuit 220 includes a first amplifier 220a, a first input capacitor 221, a first feedback capacitor 222, a second input capacitor 223, and a second feedback capacitor 224. The second amplifier circuit 240 includes a second amplifier 230a, a third input capacitor 231, a third feedback capacitor 232, a fourth input capacitor 234, and a fourth feedback capacitor 235.

The high input voltages HV_in_1 and HV_in_2 provided to the input HV switch 210 can be, for example, 40 Volts (V), and can range from −10V to +50V. The capacitive coupling by the input capacitors 221, 223 and 231, 234 permits low voltage amplifiers 220a, 230a to be used such that only approximately 1.5 V is at the inputs to the amplifiers 220a, 230a.

The feedback capacitors 222, 224 and 232, 235 are configured to hold the offset voltage of the amplifier 220a and 230a, whereas the input capacitors 221, 223 and 231, 234 are configured to hold the common mode voltage. By implementing two amplifier circuits 220, 230 that alternate between amplifying and sampling in a "ping pong" manner, aliasing can be reduced or eliminated because the input is always driving the output. In other words, there is not a period of time during which the input signal is not being amplified, which could occur if one were to implement only a single amplifier alternating between amplification and sampling modes of operation. In such an implementation, the single amplifier sampling mode could result in aliasing of the signal.

The amplifier circuits 220, 230 are configured to amplify a differential input signal provided across inputs of each amplifier, inputs HV_in_A1 and HV_in_A2 for amplifier circuit 220, and inputs HV_in_B1 and HV_in_B2 for amplifier circuit 230. The first input capacitor 221 is coupled between the input HV switch 210 and the input of the amplifier 220a. The first feedback capacitor 222 is coupled between the input of the amplifier 220a and the output Amp_out_A1 of the amplifier 220a. The second input capacitor 223 is coupled between the input HV switch 210 and the input of the amplifier 220a. The second feedback capacitor 224 is coupled between the input of the amplifier 220a and the output Amp_out_A2 of the amplifier 220a. The third input capacitor 231 is coupled between the input HV switch 210 and the input of the amplifier 230a. The third feedback capacitor 232 is coupled between the input of the amplifier 230a and the output Amp_out_B1 of the amplifier 230a. The fourth input capacitor 234 is coupled between the input HV switch 210 and the input of the amplifier 230a. The fourth feedback capacitor 235 is coupled between the input of the amplifier 230a and the output Amp_out_B2 of the amplifier 230a. It is desired that each of the input capacitors 221, 223, 231, 234 and the feedback capacitors 222, 224, 232, 235 should be a same type of capacitor and same amount of capacitance. The input capacitors and feedback capacitors should match in size and type according to the techniques of the present disclosure. The gain of the amplifier circuits 220, 230 is given by the ratio of the input capacitors to the feedback capacitors, as will be appreciated.

The input HV switch 210 is coupled to the first amplifier circuit 220 and the second amplifier circuit 230. The input HV switch 210 can include a plurality of switches for switching between a first phase and a second phase. For example, the input switch 210 couples the input signal to the first amplifier circuit 220 during the first phase to allow the first amplifier 220a to amplify while the second amplifier is in its sampling phase, and couples the input signal to the second amplifier circuit 230 during the second phase to allow the second amplifier 230a to amplify while the first amplifier is in its sampling phase. The sampling phase may be referred to herein as an "autozero" phase.

Note that the terms "first" and "second" may be used interchangeably to refer to either phase of the sensor. During the "first" phase the first amplifier may be amplifying while the second amplifier may be sampling and during the "second" phase the first amplifier may be sampling while the second amplifier may be amplifying. Likewise, during the "first" phase of operation the first amplifier may be sampling while the second amplifier may be amplifying and during the "second" phase the first amplifier may be amplifying while the second amplifier is sampling.

The output switch 240 is configured to determine which amplifier circuit 220, 230 is coupled to the output LV_out_1, LV_out_2, for example a first amplifier can be coupled to the output during a first phase and a second amplifier can be coupled to the output during a second phase. This can be coordinated with the input switch 210 to ensure that the amplifier that is amplifying is coupled to the input and the output and the amplifier that is in its sampling phase is not coupled to either the input switch 210 or the output switch 240. The output switch 240 can include optional resistors 242, 244 to convert voltage to current for an analog-to-digital (ADC) implementation. The output switch 240 is coupled to the output (Amp_out_A1, Amp_out_A2) of the first amplifier circuit 220 and the output (Amp_out_B1, Amp_out_B2) of the second amplifier circuit 230. For example, the output switch 240 can couple the first amplifier circuit 220 to the output LV_out_1, LV_out_2 during the first phase and couple the second amplifier circuit 230 to the output LV_out_1, LV_out_2 during the second phase.

In this circuit 200, there are two parallel signal paths, each having a capacitively coupled amplifier circuits 220, 230, with each path having a different mode of operation. The amplifiers alternate between amplifying and sampling in a "ping pong" manner, allowing large common mode transients to be handled by the circuit. Furthermore, use of capacitive amplifiers alternating between two phases of operation can prevent aliasing, which could occur if only one capacitive amplifier were used.

Figure 3:
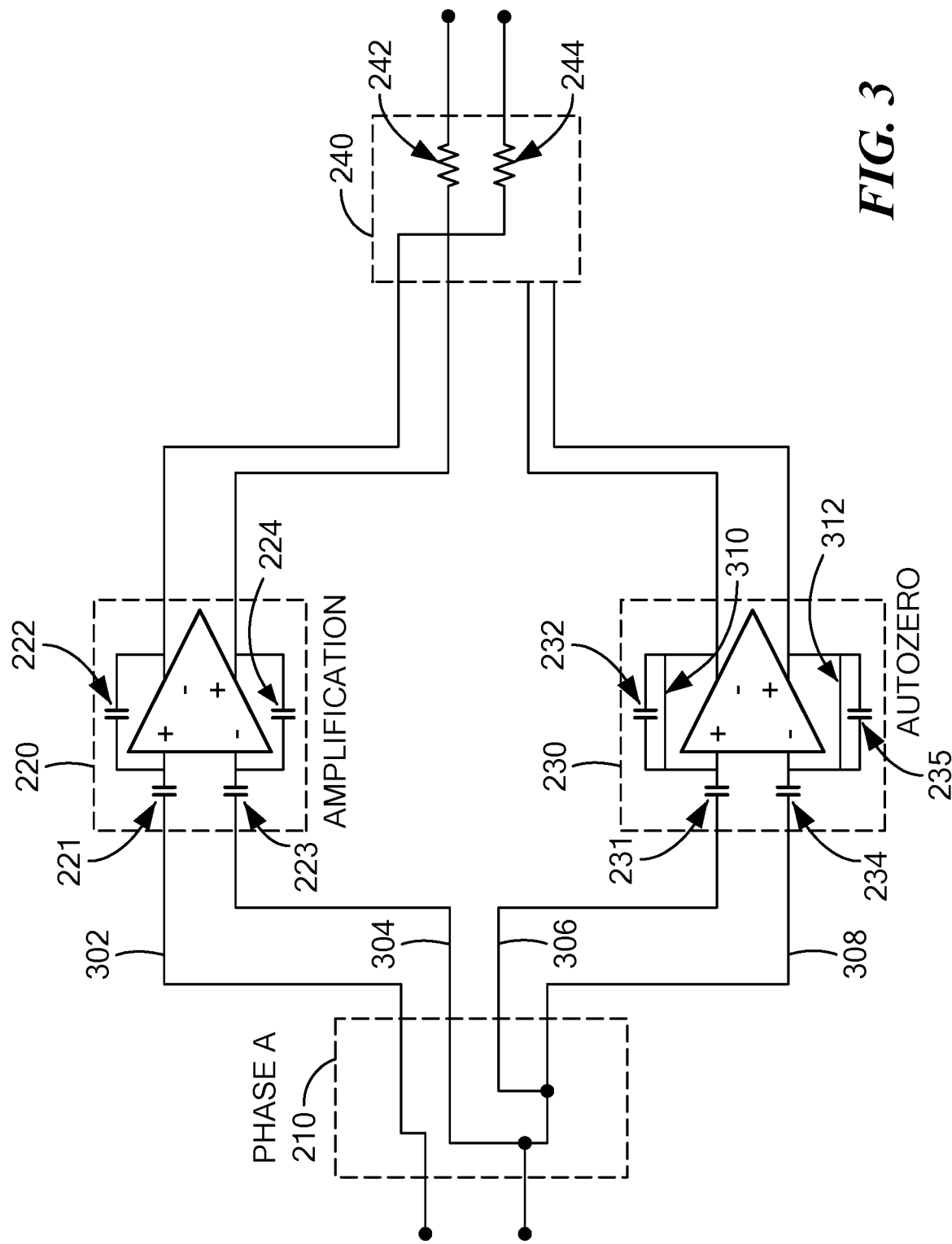
FIG. 3 is a block diagram of the circuit of FIG. 2 in a first phase of operation, according to the present disclosure.

The first phase of operation is shown in FIG. 3, with the amplifier circuit 220 amplifying the input signal, and the amplifier circuit 230 sampling mode of operation. The second phase of operation is shown in FIG. 4, with the amplifier circuit 220 now sampling and the amplifier circuit 230 amplifying the input signal.

FIG. 3 is a block diagram of the circuit of FIG. 2 in a first phase of operation, according to the present disclosure in which the amplifier circuit 220 is amplifying and the amplifier circuit 230 is sampling. It will be appreciated that the input capacitors 221, 223 provide voltage isolation for an input signal. The input capacitors 221, 223 are configured to hold the common mode voltage and the feedback capacitors 222, 224 are configured to hold the offset voltage of the amplifier, as will be appreciated in light of the present disclosure. The voltage across the input capacitors 221, 223 (or 231, 234) that is samples can include an input common mode voltage, an output common mode voltage, and an input offset voltage of the respective amplifier. The gain of the amplifier 220a is given by the ratio of the feedback capacitors 222, 224 to the input capacitors 221, 223 and the gain of the amplifier 230a is given by the ratio of the feedback capacitors 232, 235 to the input capacitors 231, 234.

Figure 6:
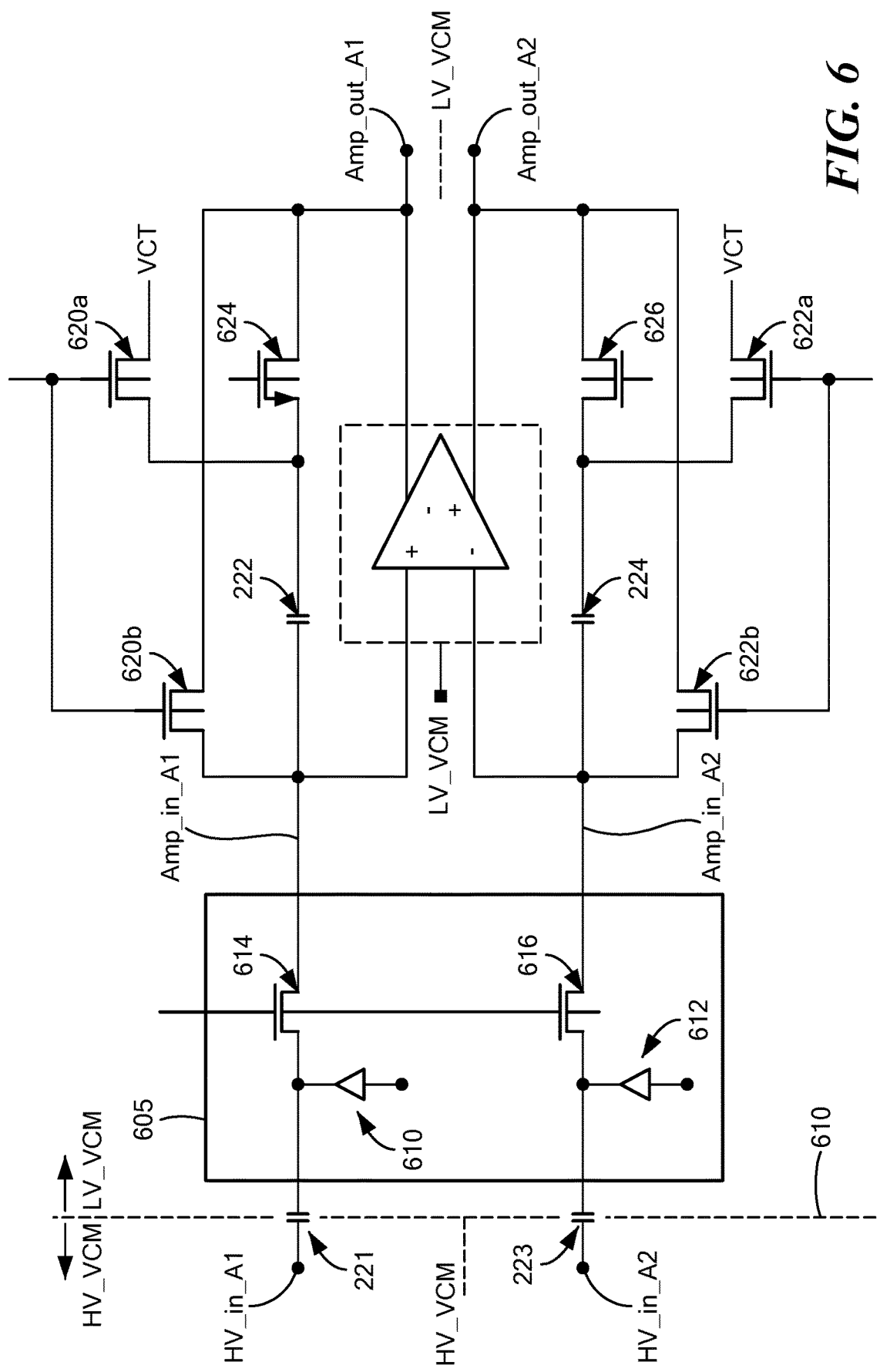
FIG. 6 is an example schematic diagram showing the capacitively coupled amplifier of FIG. 2 in greater detail, according to the present disclosure.

During the first phase of operation, as shown in FIG. 3, the first amplifier circuit 220 is configured to amplify a differential input signal provided across the first and second inputs 302, 304. The output resistors 242, 244 are coupled to the first amplifier circuit 220 during the first phase to provide the amplified signal at the output switch 240. During the first phase of operation, the second amplifier circuit 230 samples the voltage at the third and fourth inputs 306, 308 in an "autozero" phase or sampling phase. During the sampling phase, the offset of the amplifier is held on the feedback capacitor for future use, as described in greater detail herein. This can be accomplished, for example, by shorting input and output of the amplifier and connecting the feedback capacitor to a constant voltage at 310, 312, which may be a bias voltage that is one-half of the supply voltage. Refer to FIG. 6 and corresponding description for greater detail. During the first phase of operation, the second amplifier circuit 230 samples an offset of the second amplifier 230a on the third feedback capacitor 232 and on the fourth feedback capacitor 235.

Figure 4:
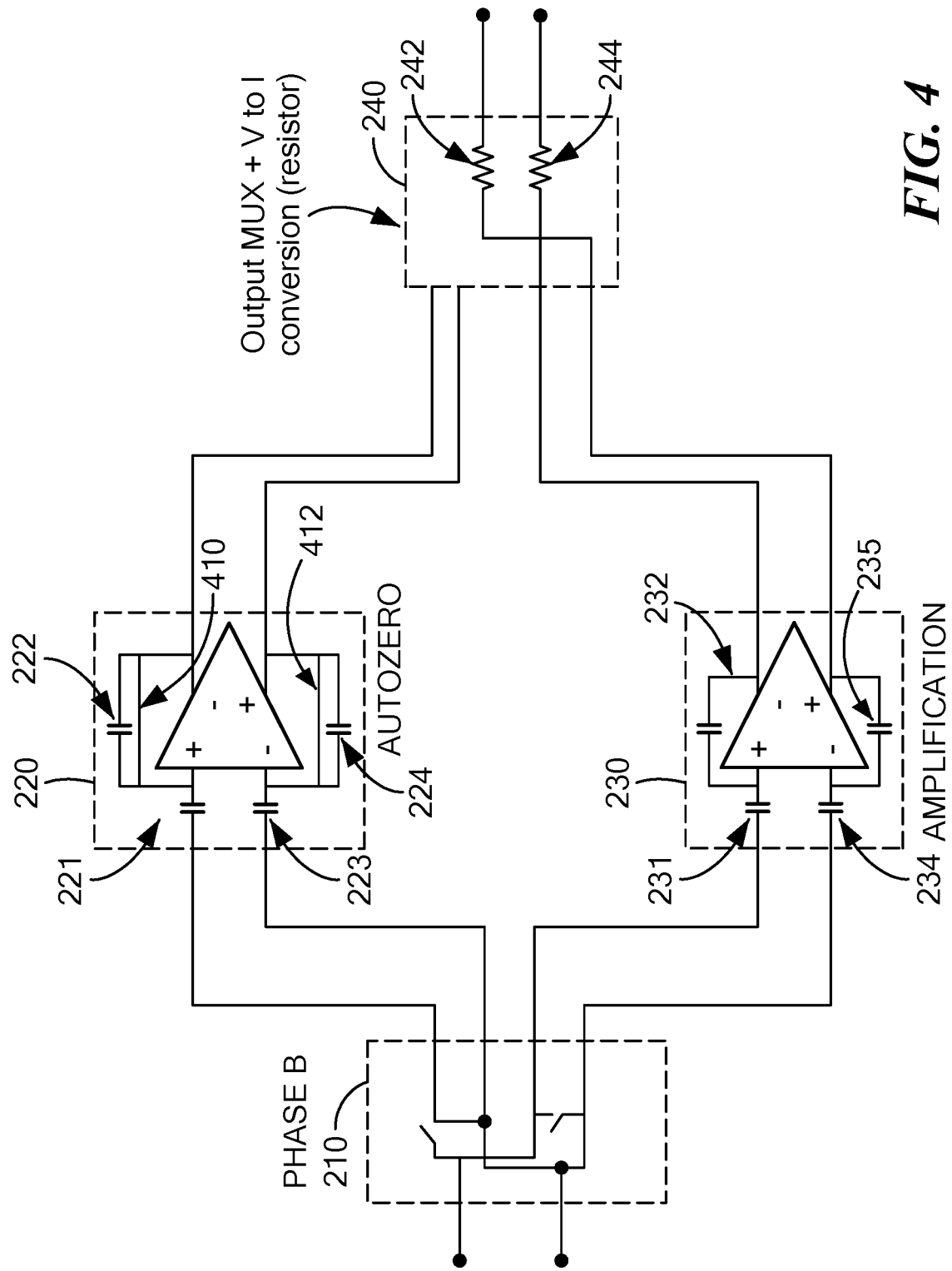
FIG. 4 is a schematic diagram of the circuit of FIG. 2 in a second phase of operation, according to the present disclosure.

FIG. 4 is a schematic diagram of the circuit of FIG. 2 in a second phase of operation, according to the present disclosure. The input capacitors 231, 234 provide voltage isolation for the input signal. During the second phase of operation, the second amplifier circuit 230 is configured to amplify a differential input signal provided across first and second inputs 406, 408. During the second phase of operation, the first and second feedback capacitors 222, 224 are decoupled from the input and the output, and the first amplifier circuit 220 is configured to sample the voltage at the first input 402 and the second input 404 via the input capacitor 221 and the input capacitor 223, respectively. During the second phase of operation, the second amplifier circuit 230 amplifies an input signal at the input of the second amplifier 230a. During the second phase of operation, the output resistors 242, 244 are coupled to the second amplifier circuit 230 so that the output of the second amplifier circuit 230 is output by the circuit. During the second phase of operation the first amplifier circuit 220 stores an offset of the first amplifier 220a on the input capacitors 221 and 223 by connecting the feedback capacitors to a bias voltage at 410, 412.

Figure 5:
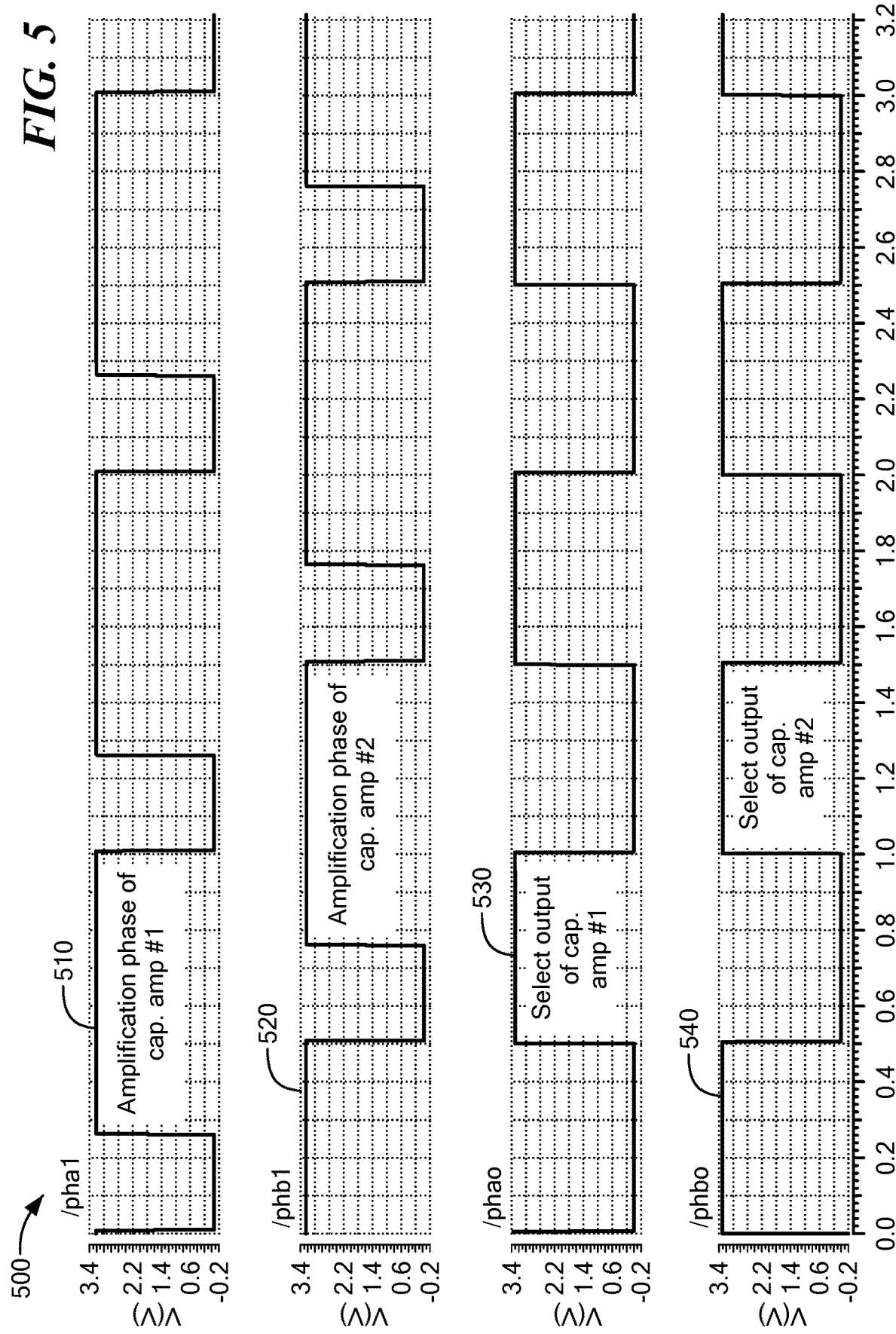
FIG. 5 is a graph showing the various switch control waveforms for controlling the circuit of FIG. 2, according to the present disclosure.

FIG. 5 is a graph 500 showing the various switch control waveforms for controlling the circuit of FIG. 2, according to the present disclosure. The switch control signals 510, 520 control the input switch 210 and thus control which amplifier circuit is coupled to the input signals HV_in_1 and HV_in_2 to amplify and which amplifier circuit is coupled to sample the input common mode voltage output common mode voltage and amplifier input offset voltage (i.e., autozero). The switch control signals 530, 540 control selecting the output of the amplifiers (for example, selecting which amplifier circuit 220 or 230 is connected to the output switch 240). The switch control signals 510, 520, 530, 540 can be generated by an on-chip controller from an oscillator.

In the switch control signals 510, 512, the amplifier is amplifying when the signal goes high and sampling when the signal goes low. While one amplifier is amplifying, the other amplifier is sampling, and the two amplifiers continue alternating between these two phases in a ping pong manner, bouncing back and forth. The alternating between amplifying and sampling in this manner allows for large common mode transients to be handled. Note that there is a small overlap when both amplifiers are amplifying for a predetermined period of time to reduce aliasing of the output signal.

In the switch control signals 530, 540, either one or the other amplifier is selected for output, one at a time, in an alternating manner as shown.

FIG. 6 is an example schematic diagram showing one of the capacitively coupled amplifier circuits of FIG. 2 in greater detail, according to the present disclosure. While the detail of the amplifier circuit 220 is shown in greater detail in FIG. 6, it will be appreciated that the structure and techniques are likewise applicable to amplifier circuit 230. As described herein, the input capacitors 221, 223 accommodate a large voltage drop, as the common mode voltage (VCM) at the input to the capacitors is a high voltage HV_VCM, which for example may be swinging between −5 and 40V, whereas the output of the capacitors has a fixed and relatively low common mode voltage LV_VCM which may for example be 1.5V. The dotted line 610 illustrates the separation between the high voltage common mode voltage HV_VCM on the input side to the input capacitors 221, 223 and the low voltage common mode voltage LV_VCM on the output side of the input capacitors 221, 223.

The circuit includes a HV and transient common mode protection circuit 605 having diodes 610, 612, which may be Zener diodes for example, and switches 614, 616. The diodes 610, 612 can suppress large voltage transients to protect the circuit against damage. The switches 614, 616 within the HV and transient common mode protection circuit 605 can be used for a sleep mode of operation and/or disable of the amplifier or the overall circuit as needed.

The amplifier includes sampling phase switches 620a, 620b, 622a, 622b and amplification phase switches 624, 626 to control the sampling and amplification phases of operation, respectively. The drain of switch 620a and switch 622a are connected to the control voltage VCT to achieve connecting the feedback capacitors 222, 224 to the constant voltage VCT. The control voltage may be a bias voltage that is one-half the supply voltage, LV_VCM for example. The gates of the sampling switches 620a, 620b, 622a, and 622b are tied together and the gates of the amplifier switches 624, 626 are tied together.

During the amplification phase, the amplification phase switches 624, 626 are on (i.e., "closed") to allow for amplification of the input signal HV_in_A1, HV_in_A2, and the sampling phase switches 620a, 620b, 622a, 622b are off (i.e., "opened").

During the sampling phase, the amplification phase switches 624, 626 are off (i.e., "opened") and the sampling phase switches 620a, 620b, 622a, 622b are on (i.e., "closed") and the inputs HV_in_A1 and HV_in_A2 are tied together and through the input HV switch 210 are sampling HV input common mode voltage from HV_in_2 as depicted or it can be also HV_in_1 see FIG. 2. See, for example, the sampling switches 620a, 620b, 622a, 622b having their gates connected together. The amplifier 220a is connected in a unity gain configuration during the sampling phase, and thus the offset is held across the input terminals. The feedback capacitors 222, 224 are connected to the control voltage VCM through sampling phase switch 620a for feedback capacitor 222 and sampling phase switch 622a for feedback capacitor 224. The offset of the amplifier is held on feedback capacitors 232, 235 by shorting the input and the output of the amplifier Amp_in_A1 and Amp_out_A1 are shorted by the sampling switch 620b, and Amp_in_A2 and Amp_in_S2 is shorted by the sampling switch 622b. The feedback capacitors 232, 235 are connected to constant voltage, VCT.

During the sampling phase, the input offset of the amplifier is sampled on the feedback capacitors 222, 224 and the high voltage input common mode voltage is sampled on the "left" electrode of the input capacitors 221, 223 and LV_VCM plus input offset of the amplifier is sampled on their "right" electrode. Thus, the input capacitors are charged up to the high voltage, which for example may be swinging between −5 and 40V. Then, when the amplifier swaps to the second amplification phase, the transition is improved by already having the charged common mode voltage on the input capacitors 221, 223 and there is no large common mode voltage swing that would occur if the input capacitors had not been charged during the sampling phase. Accordingly, the input capacitors 221, 223 effectively act as a high voltage isolator. By charging the input capacitors to the high voltage value while sampling (e.g., sampling at the high voltage), when the amplifier next transitions to amplification, the transition is thus smoother because the capacitors are already charged when the amplifier enters its amplification phase, thereby rejecting the large common mode voltage.

Figure 7:
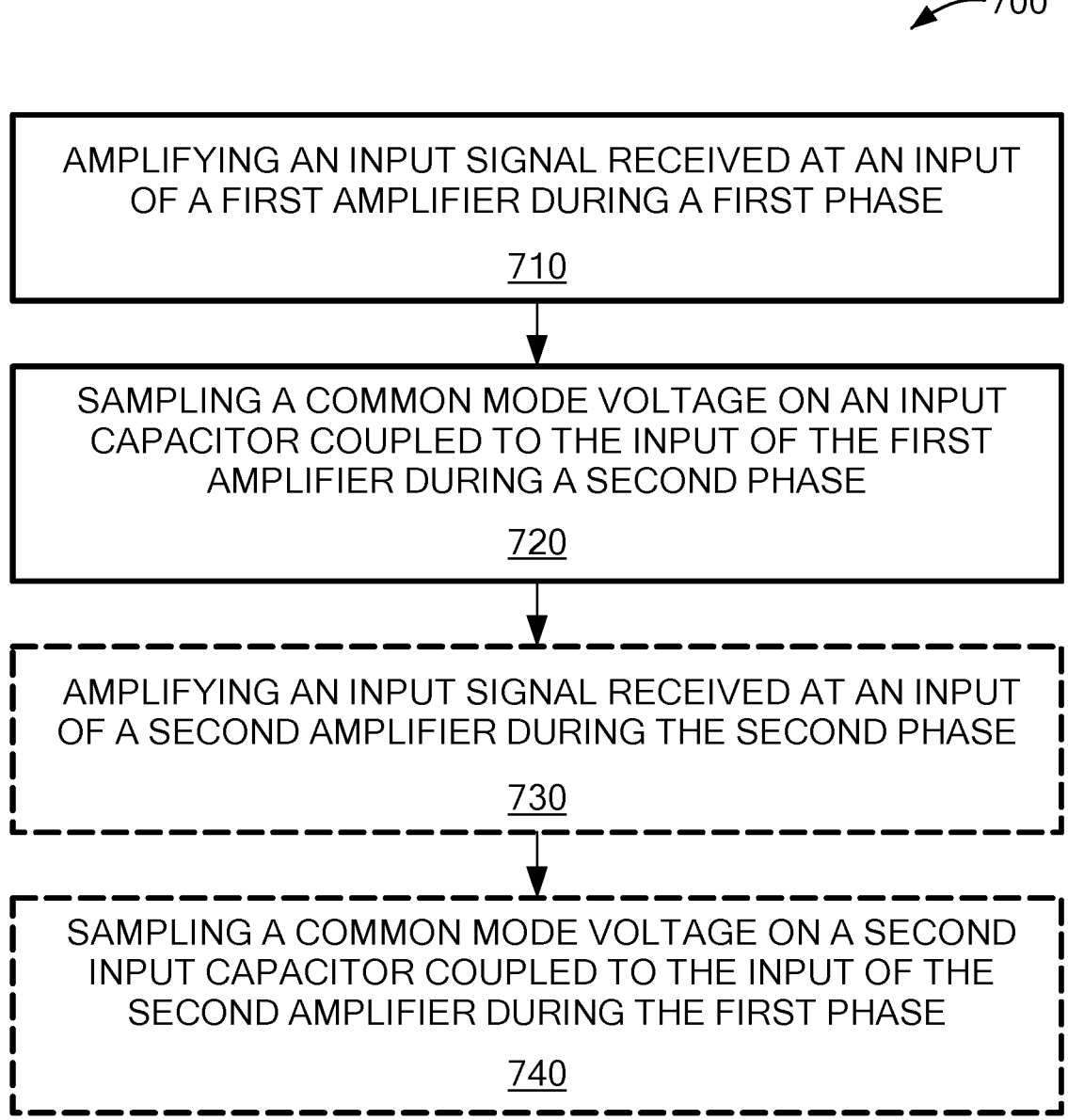
FIG. 7 is a flow chart of a method showing the two phases of operation, according to the present disclosure.

FIG. 7 is a flow chart of a method showing the two phases of operation, according to the present disclosure. Although shown as four consecutive elements, it will be appreciated that these can occur in any order, with some or all steps occurring simultaneously (substantially or at least partially at the same time).

The method 700 commences at block 710 with amplifying an input signal received at an input of a first amplifier during a first phase. Then, the method continues to block 720 with sampling an input common mode voltage, an output common mode voltage, and an amplifier input offset voltage on an input capacitor coupled to the input of the first amplifier during a second phase.

The method can include at block 730 amplifying the input signal received at an input of a second amplifier during the second phase. It will be appreciated that block 730 may occur at the same time as the sampling of the common mode voltage on an input capacitor coupled to the input of the first amplifier (e.g., block 720). The method can further include at block 740 sampling a common mode voltage on a second input capacitor coupled to the input of the second amplifier during the first phase. Sampling the common mode voltage on an input capacitor can include sampling an input common mode voltage, an output common mode voltage, and an amplifier offset voltage on an input capacitor coupled to the input of the second amplifier during a first phase. It will be appreciated that block 740 may occur at the same time as the amplifying the input signal received at an input of the first amplifier during the first phase (e.g., block 710).

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Having described embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A circuit for sensing a differential voltage, the circuit comprising:
   a first amplifier having first and second inputs and first and second outputs;
   a first input capacitor coupled to the first input;
   a second input capacitor coupled to the second input;
   a first feedback capacitor selectively coupled between the first input and the first output;
   a second feedback capacitor selectively coupled between the second input and the second output;
   a second amplifier having third and fourth inputs and third and fourth outputs;
   a third input capacitor coupled to the third input;
   a fourth input capacitor coupled to the fourth input;
   a third feedback capacitor selectively coupled between the third input and the third output; and
   a fourth feedback capacitor selectively coupled between the fourth input and the fourth output;
   wherein during a second phase of operation, the first and second feedback capacitors are decoupled from the first and second outputs and the first amplifier is configured to sample at least an input common mode voltage of the first amplifier on the first input capacitor and the second input capacitor, and wherein an input offset voltage of the first amplifier is sampled on the first and second feedback capacitors;
   wherein during a first phase of operation, the first feedback capacitor is coupled between the first input and the first output, the second feedback capacitor is coupled between the second input and the second output, and the first amplifier is configured to amplify a differential input signal provided across the first and second inputs, and wherein the input common mode voltage stored on the first and second input capacitors is rejected;
   wherein during the first phase of operation, the second amplifier is configured to sample at least an input common mode voltage of the second amplifier on the third input capacitor and the fourth input capacitor, and wherein an input offset voltage of the second amplifier is sampled on the third and fourth feedback capacitors; and
   wherein during the second phase of operation, the second amplifier amplifies an input differential signal at the input of the second amplifier, and wherein the input common mode voltage stored on the third and fourth input capacitors is rejected.

2. The circuit of claim 1, wherein amplifying by the second amplifier overlaps sampling by the first amplifier and amplifying by the first amplifier overlaps sampling by the second amplifier.

3. The circuit of claim 1, wherein amplifying by the first amplifier overlaps for a predetermined period of time with amplifying by the second amplifier.

4. The circuit of claim 1, further comprising an input switch coupled between first and second inputs of the circuit and the first, the second, the third and the fourth input capacitors of the first and second amplifiers.

5. The circuit of claim 4, wherein the input switch comprises a plurality of switches for switching between the first phase and the second phase.

6. The circuit of claim 4, wherein the input switch couples the input common mode signal to the respective input capacitors during the first phase and couples the input differential signal to the respective input capacitors during the second phase.

7. The circuit of claim 1, further comprising an output switch coupled to the outputs of the first amplifier and the first and second outputs of the second amplifier and outputs of the circuit.

8. The circuit of claim 7, wherein the output switch couples the output of the first amplifier to the circuit output during the first phase and the output of the second amplifier to the circuit output during the second phase.

9. The circuit of claim 1, further comprising sampling phase switches and amplification phase switches coupled between the respective inputs and outputs of each amplifier.

10. A method comprising:
sampling, by a first amplifier, at least an input common mode voltage of the first amplifier at first and second input capacitors coupled, respectively, to first and second inputs of the first amplifier, wherein the input offset voltage of the first amplifier is sampled on the first and second feedback capacitors during a second phase;
amplifying, by the first amplifier, an input differential signal provided across the first and second inputs of the first amplifier and rejecting an input common mode signal which is stored on the first and second input capacitors during a first phase of operation;
sampling, by a second amplifier, at least an input common mode voltage of the second amplifier on third and fourth input capacitors coupled, respectively, to third and fourth inputs of the second amplifier and wherein the input offset voltage of the second amplifier is sampled on third and fourth feedback capacitors during the first phase; and
amplifying, by the second amplifier, an input signal provided across the third and fourth inputs of the second amplifier and rejecting an input common mode signal stored on the third and fourth input capacitors during the second phase.

11. The method of claim 10, wherein, during the first phase of operation, a first feedback capacitor is coupled between the first input and the first output, and a second feedback capacitor is coupled between the second input and the second output.

12. The method of claim 11, wherein during the second phase of operation, the first and second feedback capacitors are decoupled from the output.

13. An apparatus for sensing a small differential voltage superposed on a high voltage (HV) common mode voltage, the apparatus comprising:
means for amplifying an input differential signal provided across first and second inputs and rejecting an input common mode signal stored on first and second input capacitors during a first phase;
means for sampling at least the input common mode voltage on the first and second input capacitors coupled, respectively, to the first and second inputs and wherein a first input offset voltage is sampled on the first and second feedback capacitors during a second phase;
means for sampling at least an input common mode voltage on third and fourth input capacitors coupled, respectively, to third and fourth inputs and wherein a second input offset voltage is sampled on the third and fourth feedback capacitors during the first phase; and
means for amplifying an input differential signal provided across the third and fourth inputs and rejecting the input common mode signal stored on the third and fourth input capacitors during the second phase.

14. The circuit of claim 1:
wherein the first amplifier is configured to sample the input common mode voltage, an output common mode voltage, and the input offset voltage of the first amplifier on the first input capacitor and the second input capacitor during the second phase of operation; and
wherein the second amplifier is configured to sample the input common mode voltage, an output common mode voltage, and the input offset voltage of the second amplifier on the third input capacitor and the fourth input capacitor during the first phase of operation.

15. The method of claim 10:
wherein sampling at least the input common mode voltage of the first amplifier during the second phase comprises sampling, by the second amplifier, the input common mode voltage, an output common mode voltage, and the input offset voltage of the first amplifier at first and second input capacitors; and
wherein sampling at least the input common mode voltage of the second amplifier during the first phase comprises sampling, by the second amplifier, the input common mode voltage, an output common mode voltage, and the input offset voltage of the second amplifier on third and fourth input capacitors coupled.

16. The apparatus of claim 13:
wherein the means for sampling at least the input common mode voltage on the first and second input capacitors is configured to sample the input common mode voltage, an output common mode voltage, and an input offset voltage on the first and second input capacitors during the second phase; and
wherein the means for sampling at least the input common mode voltage on the third and fourth input capacitors during is configured to sample the input common mode voltage, an output common mode voltage, and an input offset voltage on third and fourth input capacitors during the first phase.

* * * * *

UNITED STATES PATENT AND TRADEMARK OFFICE
CERTIFICATE OF CORRECTION

PATENT NO. : 10,985,720 B2
APPLICATION NO. : 16/435884
DATED : April 20, 2021
INVENTOR(S) : Martin Drinovsky et al.

It is certified that error appears in the above-identified patent and that said Letters Patent is hereby corrected as shown below:

On the Title Page

Item (57) Abstract, Line 2 delete "second output," and replace with --second outputs,--.

In the Specification

Column 1, Line 56 delete "the output," and replace with --the second output,--.

Column 2, Line 31 delete "couples" and replace with --couple--.

Column 2, Line 54 delete "capacitor is coupled" and replace with --capacitor coupled--.

Column 2, Line 55 delete "capacitor is coupled" and replace with --capacitor coupled--.

Column 4, Line 4 delete "mode can" and replace with --mode voltage can--.

Column 4, Line 26 delete "mode without" and replace with --mode voltage without--.

Column 6, Line 18 delete "having a" and replace with --having--.

Column 6, Line 18 delete "circuits 220, 230" and replace with --circuit 220, 230--.

Column 6, Line 43 delete "is samples" and replace with --it samples--.

Column 7, Line 32 delete "amplify and which" and replace with --amplify those signals, and which--.

Column 7, Line 33 delete "voltage output common" and replace with --voltage, output common--.

Column 8, Line 10 delete "disable" and replace with --disabling--.

Signed and Sealed this
Twenty-first Day of June, 2022

Katherine Kelly Vidal
*Director of the United States Patent and Trademark Office*

CERTIFICATE OF CORRECTION (continued)
U.S. Pat. No. 10,985,720 B2

Column 8, Line 34 delete "1 see FIG. 2." and replace with --1, see FIG. 2.--.

Column 8, Line 45 delete "amplifier Amp_in_A1 and Amp_out_A1 are shorted by" and replace with --amplifier Amp_in_A1 and Amp_out_A1 using--.

Column 8, Line 47 delete "Amp_in_S2 is shorted by" and replace with --Amp_in_S2 are shorted by--.

Column 9, Line 30 delete "as the" and replace with --as--.

In the Claims

Column 12, Line 32 delete "capacitors coupled." and replace with --capacitors.--.

Column 12, Line 42 delete "during is" and replace with --is--.